United States Patent
Song et al.

(10) Patent No.: US 7,545,164 B2
(45) Date of Patent: Jun. 9, 2009

(54) OUTPUT DRIVER FOR CONTROLLING IMPEDANCE AND INTENSITY OF PRE-EMPHASIS DRIVER USING MODE REGISTER SET

(75) Inventors: In Dal Song, Seoul (KR); Jung Bae Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/540,345

(22) Filed: Sep. 29, 2006

(65) Prior Publication Data

US 2007/0075745 A1     Apr. 5, 2007

(30) Foreign Application Priority Data

Sep. 30, 2005    (KR) .................. 10-2005-0091896

(51) Int. Cl.
*H03K 17/16*    (2006.01)
*H03K 19/003*    (2006.01)

(52) U.S. Cl. .................. 326/30; 326/27; 326/86; 326/87; 327/112; 327/264

(58) Field of Classification Search .......... 326/30, 326/82–83, 86–87, 26–27; 327/108–109, 327/333, 112, 261, 263–264

See application file for complete search history.

(56) References Cited

U.S. PATENT DOCUMENTS

| | | | | |
|---|---|---|---|---|
| 6,351,172 | B1 * | 2/2002 | Ouyang et al. | 327/333 |
| 6,452,428 | B1 * | 9/2002 | Mooney et al. | 327/108 |
| 6,674,313 | B2 * | 1/2004 | Kurisu et al. | 327/108 |
| 6,759,868 | B2 * | 7/2004 | Helt et al. | 326/30 |
| 6,856,164 | B2 * | 2/2005 | Park et al. | 326/30 |
| 6,940,302 | B1 * | 9/2005 | Shumarayev et al. | 326/26 |
| 7,112,989 | B2 * | 9/2006 | Ooshita et al. | 326/27 |
| 7,215,144 | B2 * | 5/2007 | Mitby et al. | 326/82 |
| 7,315,186 | B2 * | 1/2008 | Martin et al. | 326/87 |
| 7,391,238 | B2 * | 6/2008 | Kim et al. | 326/83 |
| 2003/0193351 | A1 * | 10/2003 | Fukui | 326/83 |
| 2004/0145394 | A1 * | 7/2004 | Nedachi | 327/112 |
| 2005/0057280 | A1 * | 3/2005 | Groen et al. | 326/86 |
| 2006/0071687 | A1 * | 4/2006 | Kim | 326/82 |
| 2006/0071688 | A1 * | 4/2006 | Uenishi | 326/82 |

\* cited by examiner

*Primary Examiner*—Vibol Tan
*Assistant Examiner*—Jason Crawford
(74) *Attorney, Agent, or Firm*—Mills & Onello, LLP (57) ABSTRACT

An output driver controls impedance using a mode register set. The output driver includes a main driving circuit that outputs and drives a main signal based on a data signal to a predetermined transmission line, an auxiliary driving circuit that outputs and drives an auxiliary signal to the transmission line, and a mode register set. The mode register set generates an impedance control signal group, a driving width control signal group and a delay control signal group. The amount of an auxiliary impedance (SIM), and the driving width and driving time point of an auxiliary signal (XSDR) can be controlled using the impedance control signal group, the driving width control signal group and the delay control signal group. Therefore, in accordance with the output driver of the present invention, the amount of output impedance (OIM), a pre-emphasis width and a pre-emphasis time point can be readily controlled, and the efficiency of the transmission of an output signal to a reception system is improved.

10 Claims, 8 Drawing Sheets

OUTPUT DRIVER FOR CONTROLLING IMPEDANCE AND INTENSITY OF PRE-EMPHASIS DRIVER USING MODE REGISTER SET

RELATED APPLICATION

This application relies for priority on Korean Patent Application number 10-2005-0091896, filed in the Korean Intellectual Property Office on Sep. 30, 2005, the entire contents of which are incorporated herein by reference.

BACKGROUND OF THE INVENTION

1. Field of the Invention

The present invention relates generally to an electronic circuit and, more particularly, to an output driver for efficiently transmitting data to a reception system.

2. Description of the Related Art

A variety of signals, including data signals, are transmitted from a transmission system to a reception system via a transmission line. In general, the transmission system includes an output driver so as to efficiently transmit data. It is very important to design the output impedance of the output driver so that it has a value corresponding to the transmission impedance of the transmission line and the reception impedance of the reception system. Furthermore, in order to emphasize a transmission signal in the initial stage of driving, a pre-emphasis technique for generating a separate auxiliary signal has been widely used. Using such a pre-emphasis technique, the efficiency of the transmission of a transmission signal can be improved. It is very important to match the amount of impedance of an auxiliary output terminal for generating the auxiliary signal, and the driving width and driving time of the auxiliary signal to the amount of impedance of a main output terminal for generating the transmission signal, and the driving width and driving time point of transmitted data, respectively. If appropriate matching is not achieved, a transmission signal may be distorted.

Figure 1:
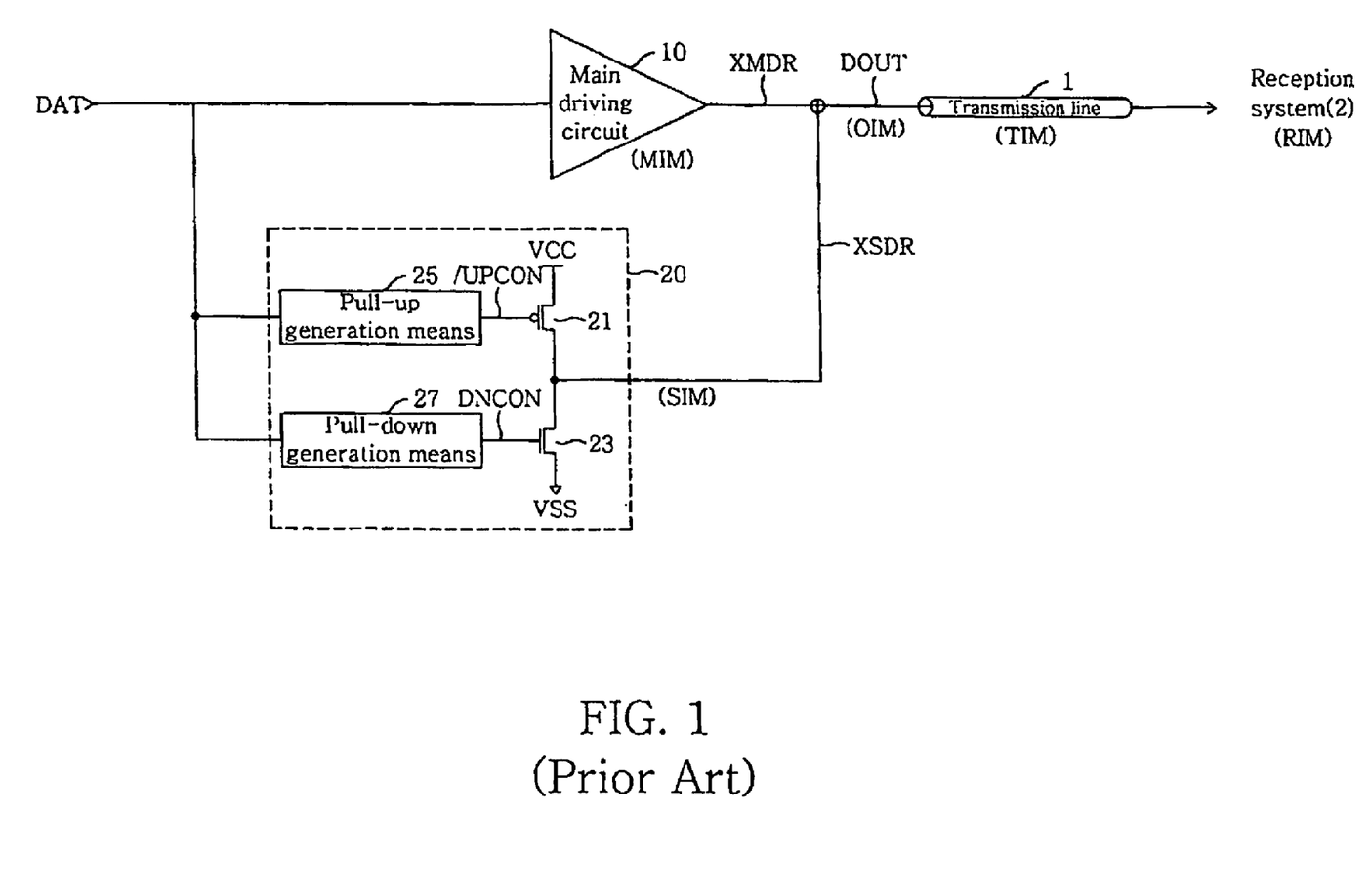
FIG. 1 is a block diagram of a prior art output driver.

FIG. 1 is a block diagram of a prior art output driver. In FIG. I, a main driving circuit 10 drives a main signal XMDR to a transmission line 1 in response to a data signal DAT. The output terminal of the main driving circuit 10 has main impedance MIM. Furthermore, the PMOS transistor 21 of an auxiliary driving circuit 20 pulls up an auxiliary signal XSDR in response to a pull-up control signal/UPCON output from a pull-up generation means 25.

Furthermore, the NMOS transistor 23 of the auxiliary driving circuit 20 pulls down the auxiliary signal XSDR in response to a pull-down control signal DNCON output from a pull-down generation means 27. The auxiliary driving circuit 20 is operated to drive the auxiliary signal XSDR in the same direction as the main signal XMDR, in the initial stage of transmission of the data signal DAT.

As a result, the main signal XMDR based on the data signal DAT is emphasized by the auxiliary signal XSDR in the initial stage of driving, and is created as an output signal DOUT.

In the output driver of FIG. 1, auxiliary impedance SIM, that is, the impedance at the output terminal of the auxiliary driving circuit 20, is fixed. Therefore, output impedance OIM, which is formed by the combination of the main impedance MIM and the auxiliary impedance SIM, is fixed.

Accordingly, the prior art output driver has a problem in that it is very difficult to match the output impedance OIM to the transmission impedance TIM of the transmission line 1 and the reception impedance RIM of a reception system 2.

Furthermore, in the output driver of FIG. 1, the initial driving time point of the auxiliary signal XSDR is fixed. Therefore, the prior art output driver has a problem in that it is difficult to control the pre-emphasis time point of an output signal.

Furthermore, in the output driver of FIG. 1, the initial driving width of the auxiliary signal XSDR is also fixed. Therefore, the prior art output driver also has a problem in that it is difficult to control the pre-emphasis width of an output signal.

SUMMARY OF THE INVENTION

A feature of the present invention is to provide an output driver that can efficiently match output impedance to transmission impedance and reception impedance.

Another feature of the present invention is to provide an output driver that can control the pre-emphasis time point of an output signal.

Still another feature of the present invention is to provide an output driver that can control the pre-emphasis width of an output signal.

According to one aspect, the present invention is directed to an output driver that generates an output signal based on a combination of a main signal and an auxiliary signal to a transmission line. The output driver of the present invention includes a main driving circuit for generating the main signal based on a received data signal to the transmission line at a main impedance; an auxiliary driving circuit for emphasizing the output signal in an initial stage of the generation of the main signal to the transmission line, the auxiliary driving circuit generating the auxiliary signal based on the data signal to the transmission line at an auxiliary impedance; and a mode register set for generating an impedance control signal group whose logic state is controlled to correspond to an external control signal group. The auxiliary impedance can be controlled using the impedance control signal group.

In one embodiment, the auxiliary driving circuit comprises: a pre-emphasis driving unit for pulling up the auxiliary signal in response to a pull-up control signal, and pulling down the auxiliary signal in response to a pull-down control signal; and a driving control signal generation unit for providing the pull-up control signal and the pull-down control signal in response to the data signal.

In one embodiment, the pre-emphasis driving unit comprises: pull-up driving means driven to pull up the auxiliary signal in response to the pull-up control signal; and pull-down driving means driven to pull down the auxiliary signal in response to the pull-down control signal. Conductance of the pull-up driving means and the pull-down driving means is controlled using the impedance control signal group.

In one embodiment, the pre-emphasis driving unit comprises: a plurality of driving means each driven to pull up the auxiliary signal in response to the pull-up control signal and to pull down the auxiliary signal in response to the pull-down control signal. At least one of the driving means is enabled in response to a corresponding signal of an impedance control signal group.

According to another aspect, the present invention is directed to an output driver that generates an output signal based on a combination of a main signal and an auxiliary signal to a transmission line. The output driver of the present invention includes a main driving circuit for generating the main signal based on a received data signal to the transmission line at a main impedance; an auxiliary driving circuit for emphasizing the output signal in an initial stage of the generation of the main signal to the transmission line, the auxiliary driving circuit generating the auxiliary signal based on the data signal to the transmission line at an auxiliary impedance; and a mode register set for generating a driving width control signal group whose logic state is controlled to correspond to an external control signal group. The driving width of the auxiliary signal is controlled by the driving width control signal group.

In one embodiment, the auxiliary driving circuit comprises: a driving control signal generation unit for providing a pull-up control signal and a pull-down control signal in response to the data signal; and a pre-emphasis driving unit for pulling up the auxiliary signal in response to the pull-up control signal and pulling down the auxiliary signal in response to the pull-down control signal.

In one embodiment, the driving control signal generation unit comprises: pull-up generation means driven to generate the pull-up control signal in response to the data signal; and pull-down generation means driven to pull down the auxiliary signal response to the pull-down control signal. The pull-up generation means and the pull-down generation means are driven to control driving widths of the pull-up control signal and the pull-down control signal, respectively, in response to the driving width control signal group.

According to another aspect, the present invention is directed to an output driver that generates an output signal based on a combination of a main signal and an auxiliary signal to a transmission line. The output driver of the present invention includes a main driving circuit for generating the main signal based on a received data signal to the transmission line at a main impedance; an auxiliary driving circuit for emphasizing the output signal in an initial stage of the generation of the main signal to the transmission line, the auxiliary driving circuit generating the auxiliary signal based on the data signal to the transmission line at an auxiliary impedance; and a mode register set for generating a delay control signal group whose logic state is controlled to correspond to an external control signal group. The driving time point of the auxiliary signal is controlled by the delay control signal group.

In one embodiment, the auxiliary driving circuit comprises: a driving control signal generation unit for providing a pull-up control signal and a pull-down control signal in response to the data signal; and a pre-emphasis driving unit for pulling up the auxiliary signal in response to the pull-up control signal and pulling down the auxiliary signal in response to the pull-down control signal.

In one embodiment, the driving control signal generation unit comprises: pull-up delay means driven to delay an activation time point of the pull-up control signal in response to the data signal; and pull-down delay means driven to delay a driving time point of the pull-down control signal in response to the data signal. The pull-up generation means and the pull-down generation means are driven to control driving time points of the pull-up control signal and the pull-down control signal, respectively, using the delay control signal group.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

The present invention will now be described in detail in connection with preferred embodiments with reference to the accompanying drawings.

Figure 2:
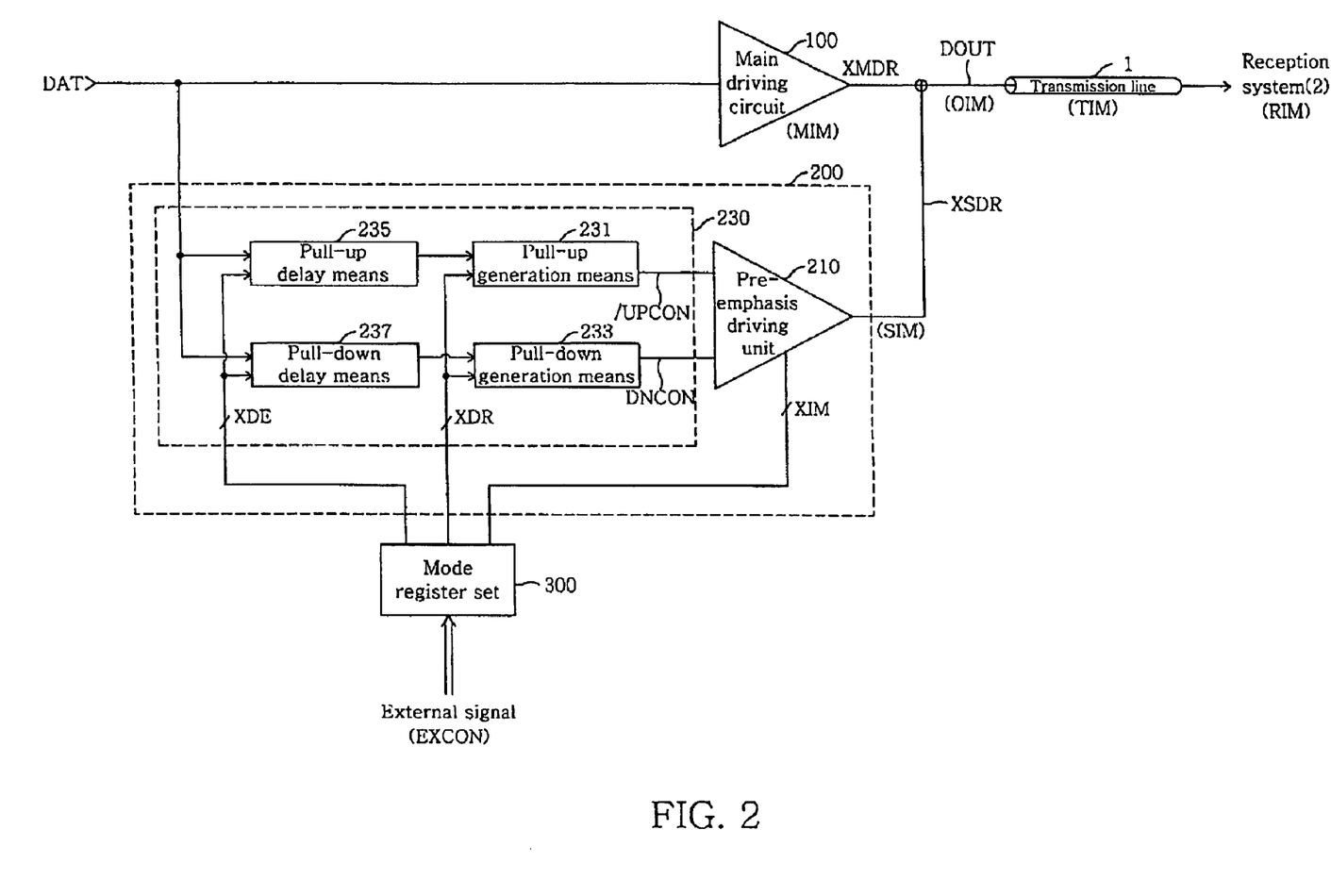
FIG. 2 is a block diagram of an output driver according to an embodiment of the present invention.

FIG. 2 is a block diagram of an output driver according to an embodiment of the present invention.

The output driver of the present invention drives an output signal DOUT at a predetermined output impedance OIM according to a received data signal DAT.

Referring to FIG. 2, the output driver of the present invention includes a main driving circuit 100, an auxiliary driving circuit 200 and a mode register set 300.

The main driving circuit 100 generates a main signal XMDR to a transmission line 1 according to the data signal DAT. Furthermore, the auxiliary driving circuit 200 generates an auxiliary signal XSDR to the transmission line 1 according to the data signal DAT. The main signal XMDR and the auxiliary signal XSDR are combined with each other and form an output signal DOUT.

In the present specification, the impedance of the output terminal of the main driving circuit 100 is referred to as "main impedance MIM", and the impedance of the output terminal of the auxiliary driving circuit 200 is referred to as "auxiliary impedance SIM". Furthermore, the impedance of the output driver of the present embodiment is referred to as "output impedance OIM". The output impedance OIM is determined by the combination of the main impedance MIM and the auxiliary impedance SIM.

The mode register set 300 receives an external control signal group EXCON, and generates an impedance control signal group XIM, a driving width control signal group XDR and a delay control signal group XDE. In the present embodiment, each of the impedance control signal group XIM, the driving width control signal group XDR and the delay control signal group (XDE) includes a plurality of signals. The logic state of the signals of the impedance control signal group XIM, the driving width control signal group XDR and the delay control signal group XDE is controlled to correspond to that of the external control signal group EXCON including a plurality of signals.

The auxiliary driving circuit 200 includes a pre-emphasis driving unit 210 and a driving control signal generation unit 230. The pre-emphasis driving unit 210 is driven to pull up the auxiliary signal XSDR in response to a pull-up control signal/UPCON. Furthermore, the pre-emphasis driving unit 210 is driven to pull down the auxiliary signal XSDR in response to a pull-down control signal DNCON. The auxiliary impedance SIM, that is, the impedance of the output terminal of the pre-emphasis driving unit 210 (the impedance of the output terminal of the auxiliary driving circuit 200), is controlled to correspond to the impedance control signal group XIM output from the mode register set 300.

Figure 3:
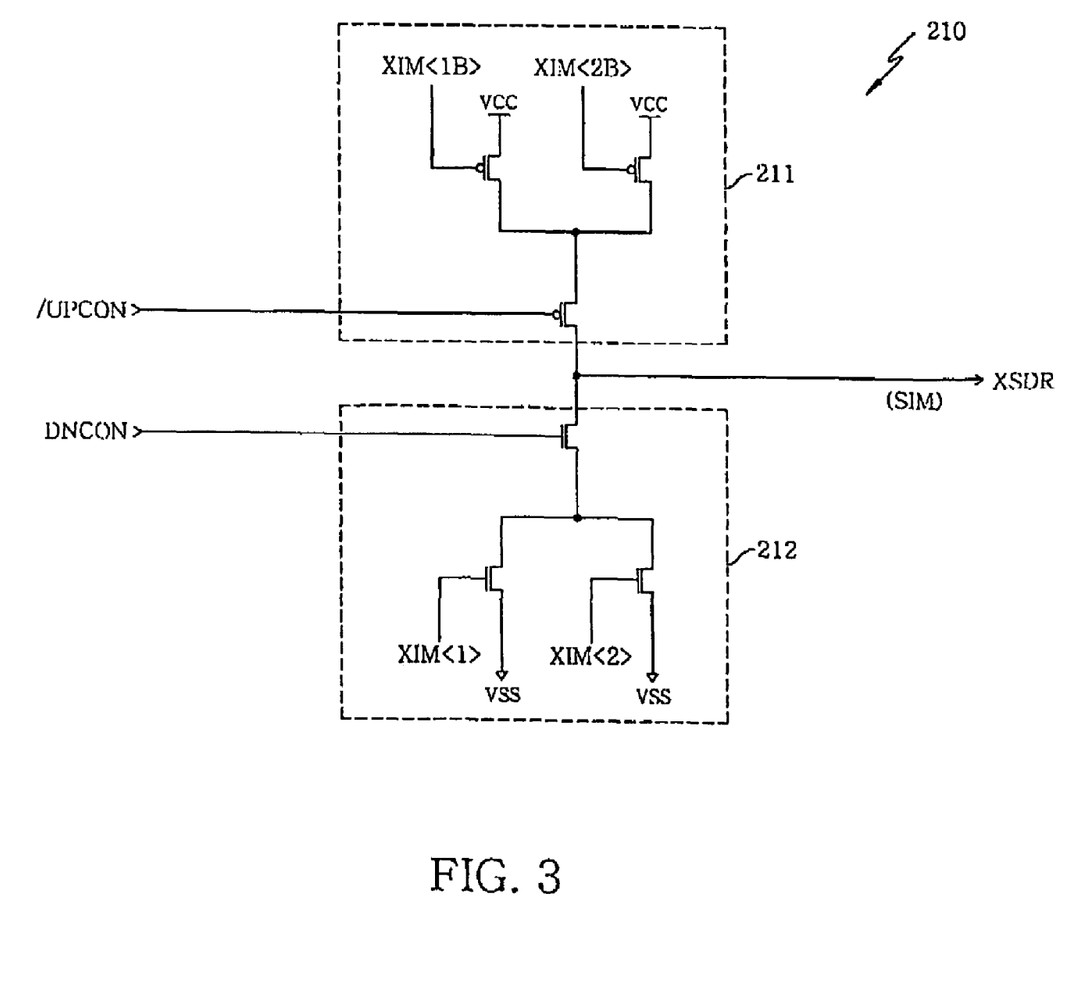
FIG. 3 is a circuit diagram illustrating an embodiment of the pre-emphasis driving unit of FIG. 2.

FIG. 3 is a circuit diagram showing an embodiment of the pre-emphasis driving unit 210 of FIG. 2. Referring to FIG. 3, the pre-emphasis driving unit 210 includes a pull-up driving means 211 and a pull-down driving means 212.

Figure 4:
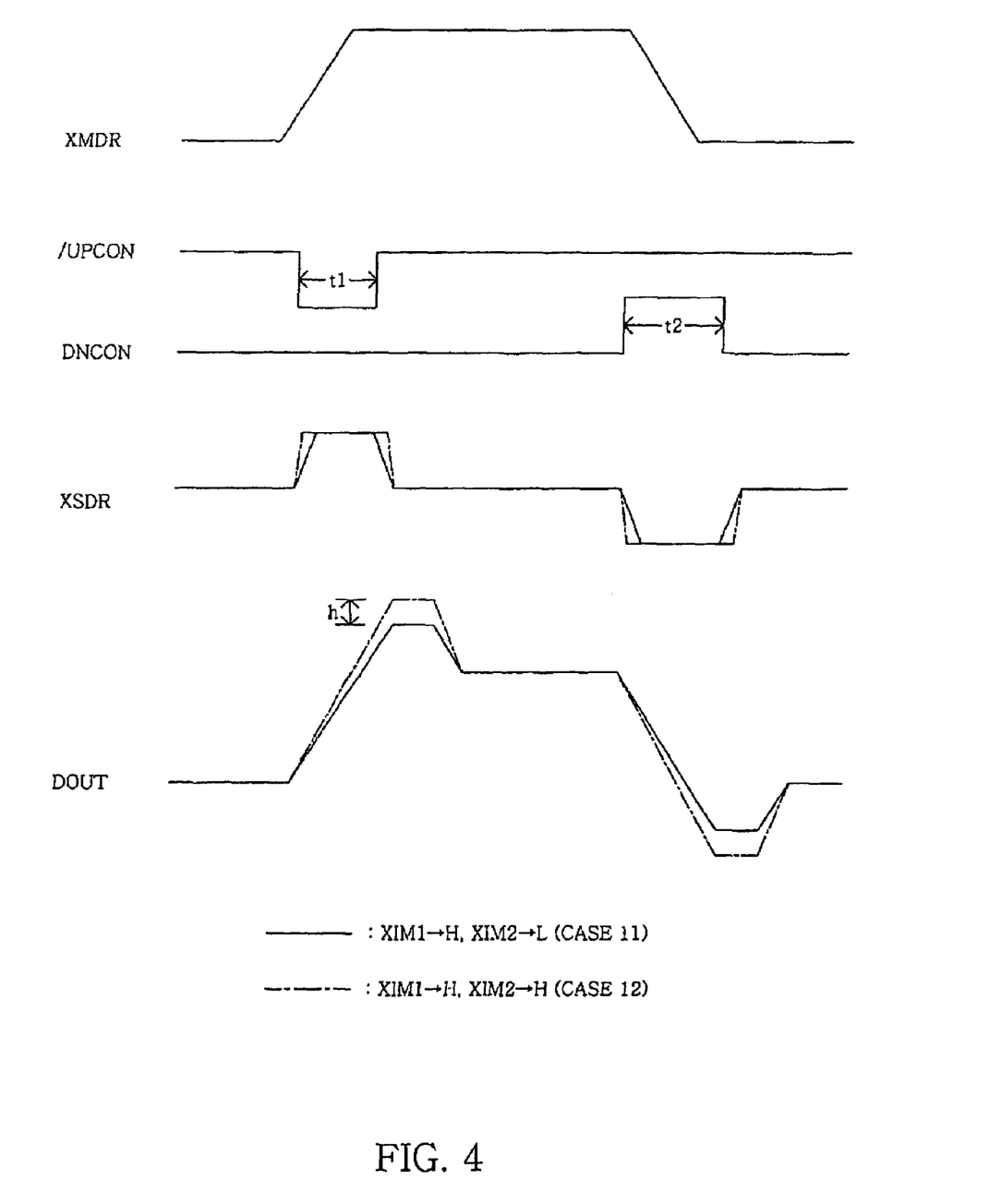
FIG. 4 is a view illustrating variation in the output signal depending on the control of output impedance in the output driver of FIG. 2.

The pull-up driving means 211 pulls up the auxiliary signal XSDR while the pull-up control signal/UPCON is activated to "L (low)" (see t1 in FIG. 4). Furthermore, the pull-down driving means 212 pulls down the auxiliary signal XSDR while the pull-down control signal DNCON is activated to "H (high)" (see t2 in FIG. 4).

In FIG. 3, signals XIM<1> to XIM<2> designate signals included in the impedance control signal group XIM. Signals XIM<1B> to XIM<2B> designate the inverse signals of the signals XIM<1> to XIM<2>, respectively.

The conductance of the pull-up driving means 211 and the pull-down driving means 212 is controlled using the impedance control signal group XIM. That is, when the signal XIM1 is "H" and the signal XIM2 is "L", the auxiliary impedance SIM has a relatively high value. Furthermore, when both the signal XIM1 and the signal XIM2 are "H", the auxiliary impedance SIM has a relatively low value.

That is, the auxiliary signal XSDR in CASE12 has a slope much steeper than that of the auxiliary signal XSDR in CASE11, as shown in FIG. 4. CASE11 corresponds to a case where the signal XIM1 is "H" and the signal XIM2 is "L". Furthermore, CASE12 corresponds to a case where the signal XIM1 is "L" and the signal XIM2 is "H".

Consequently, in CASE12, the overall output impedance OIM of the output driver according to the present invention is lower than that of CASE11, but the pull-up level of the output signal DOUT in the initial stage of driving is higher than that of CASE11 (see h in FIG. 4).

Figure 5:
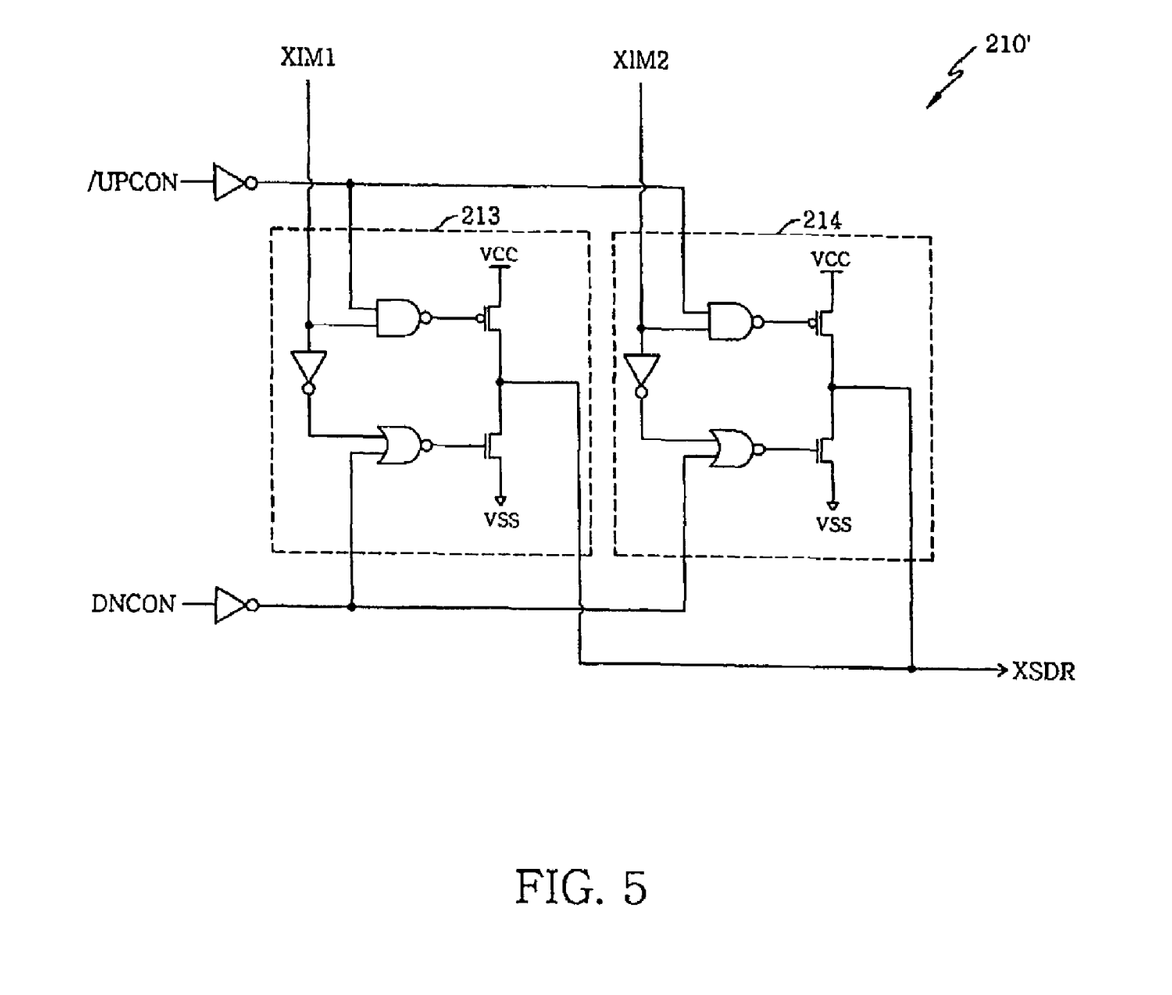
FIG. 5 is a circuit diagram showing another embodiment of the pre-emphasis driving unit of FIG. 2.

FIG. 5 is a circuit diagram showing another embodiment of the pre-emphasis driving unit of FIG. 2.

Referring to FIG. 5, a pre-emphasis driving unit 210' includes a first driving means 213 and a second driving means 214. The first driving means 213 is enabled in response to a signal XIM1 and the second driving means 214 is enabled in response to a signal XIM2.

Figure 6:
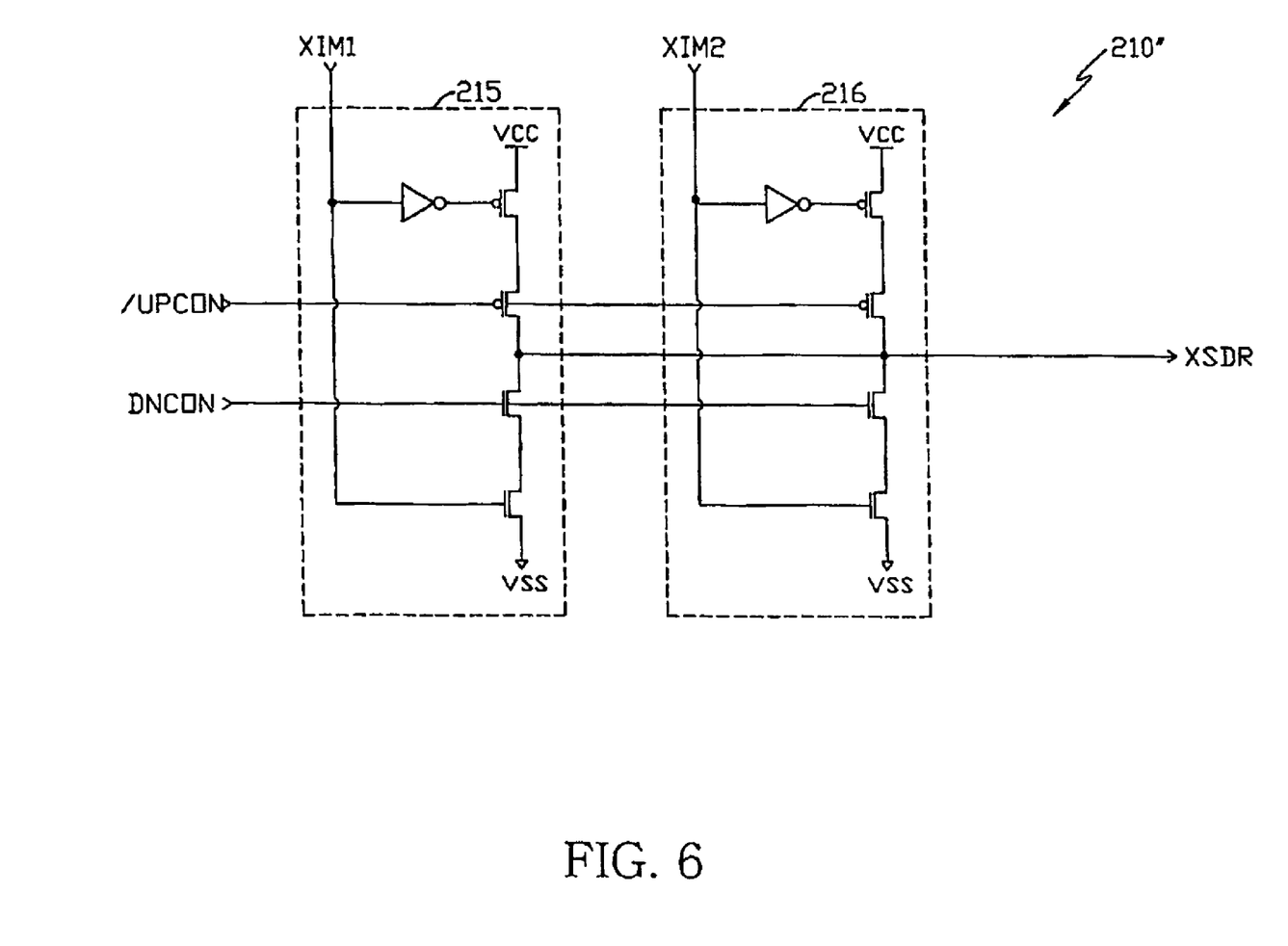
FIG. 6 is a circuit diagram showing another embodiment of the pre-emphasis driving unit of FIG. 2.

FIG. 6 is a circuit diagram showing still another embodiment of the pre-emphasis driving unit of FIG. 2.

Referring to FIG. 6, a pre-emphasis driving unit 210" includes a third driving means 215 and a fourth driving means 216. The third driving means 215 is enabled in response to a signal XIM1 and the fourth driving means 216 is enabled in response to a signal XIM2.

Even in the pre-emphasis driving units 210' and 210" of FIGS. 5 and 6, the pull-up level of the output signal DOUT in the initial stage of driving is controlled in response to the signal XIM1 and the signal XIM2 in the same manner as in the pre-emphasis driving unit 210 of FIG. 3.

The pull-up level of the output signal DOUT in the initial stage of driving is controlled as described above, so that the output impedance OIM of the output driver according to the present invention can be set to a value corresponding to the transmission impedance TIM of a transmission line and the reception impedance RIM of a reception system. As a result, in the output driver of the present invention, the efficiency of the transmission of the output signal DOUT to the reception system is improved.

Referring to FIG. 2 again, the driving control signal generation unit 230 includes a pull-up generation means 231 and a pull-down generation means 233. The pull-up generation means 231 generates the pull-up control signal/UPCON. The pull-down generation means 233 generates the pull-down control signal DNCON. The pull-up control signal/UPCON and the pull-down control signal DNCON are ultimately activated in response to the data signal DAT.

The pull-up generation means 231 and the pull-down generation means 233 are controlled using the driving width control signal group XDR output from the mode register set 300. That is, the driving widths of the pull-up control signal/UPCON and the pull-down control signal DNCON are controlled using the driving width control signal group XDR. The driving widths of the pull-up control signal/UPCON and the pull-down control signal DNCON are controlled as described above, so that the emphasis width of the output signal DOUT of the output driver of the present invention in the initial stage of driving is controlled.

Figure 7:
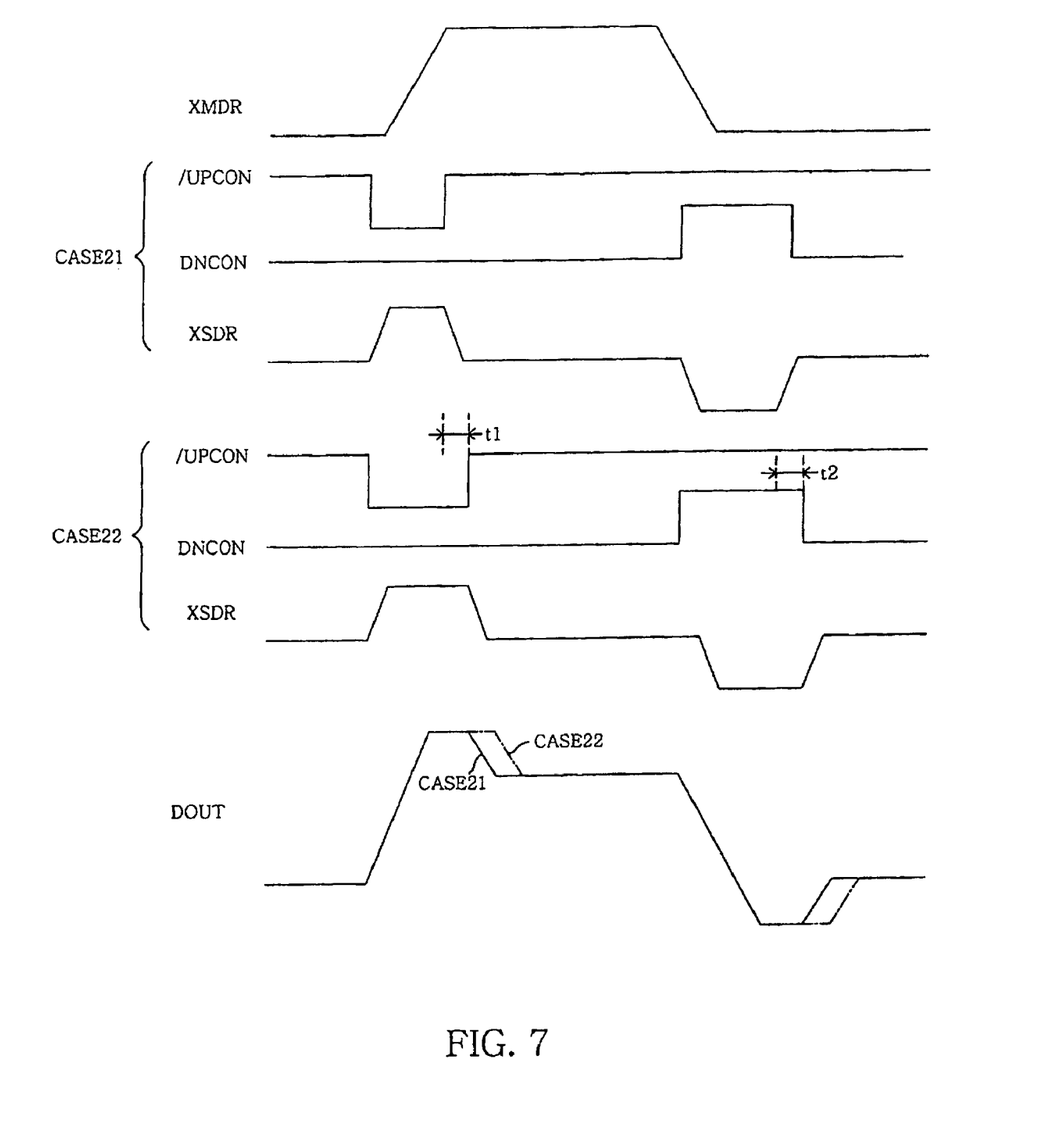
FIG. 7 is a view illustrating variation in the output signal depending on the control of a pre-emphasis width in the output driver of FIG. 2.

That is, as shown in FIG. 7, in CASE22 (a case where the driving widths of the pull-up control signal/UPCON and the pull-down control signal DNCON are relatively large), the emphasis width of the output signal DOUT in the initial stage of driving is larger than that in CASE21 (a case where the driving widths of the pull-up control signal/UPCON and the pull-down control signal DNCON are relatively small).

The emphasis width of the output signal DOUT in the initial stage of driving can be controlled as described above, so that the efficiency of the transmission of the output signal DOUT to the reception system 2 in the output driver of the present invention can be improved.

Referring to FIG. 2 again, the driving control signal generation unit 230 includes a pull-up delay means 235 and a pull-down delay means 237. The pull-up delay means 235 controls the pull-up generation means 231 and, ultimately, controls the delay of the driving time point of the pull-up control signal/UPCON. The pull-down generation means 237 controls the pull-down generation means 233 and, ultimately, controls the delay of the driving time point of the pull-down control signal DNCON. The control of the driving time points of the pull-up control signal/UPCON and the pull-down control signal DNCON is performed by the delay control signal group XDE provided from the mode register set 300.

When the delay of the driving time points of the pull-up control signal/UPCON and the pull-down control signal DNCON is controlled as described above, the driving time point of the auxiliary signal XSDR can be controlled.

Figure 8:
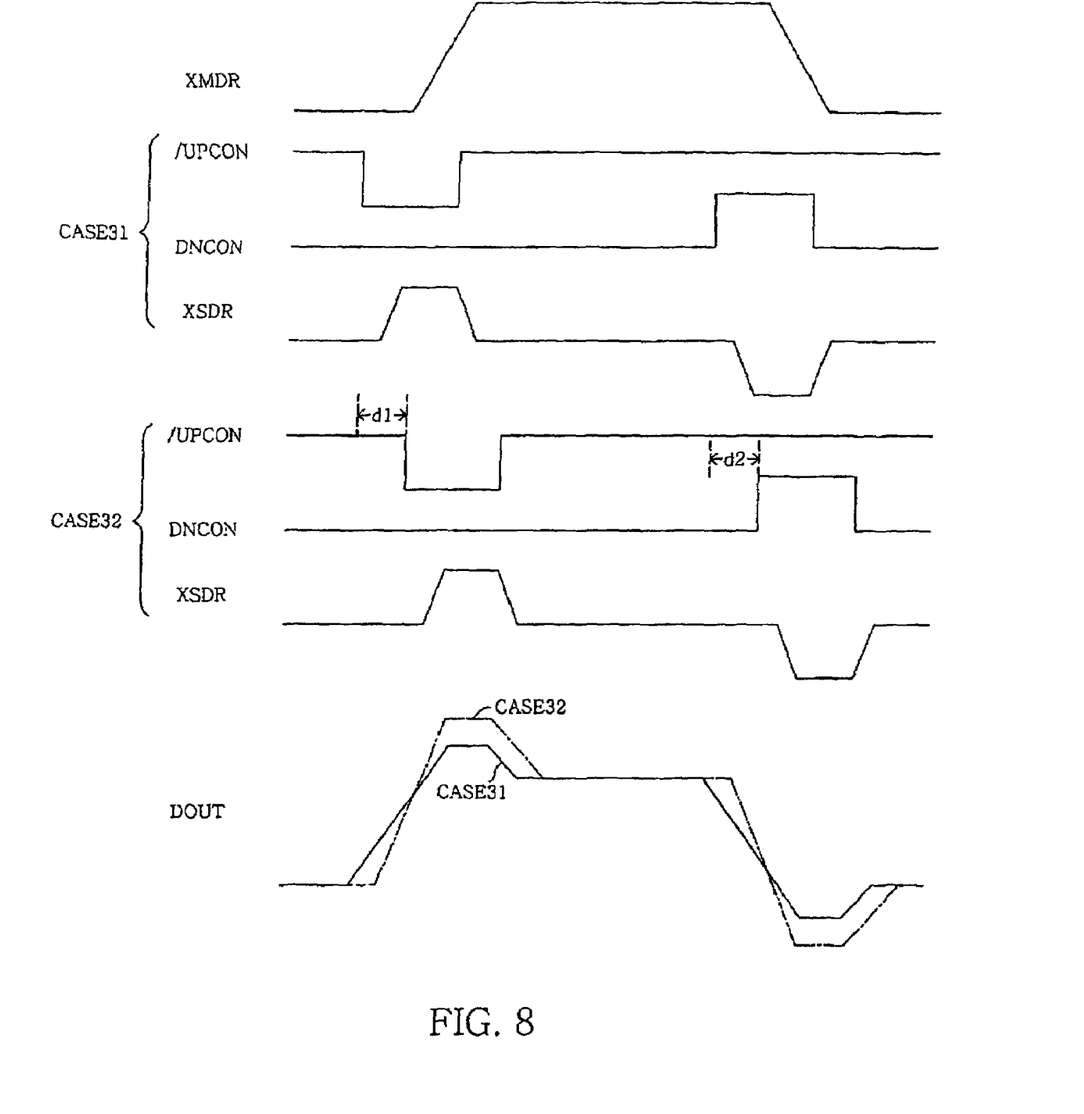
FIG. 8 is a view illustrating variation in the output signal depending on the control of a pre-emphasis time point in the output driver of FIG. 2.

As a result, as shown in FIG. 8, in CASE32 (a case where the driving time points of the pull-up control signal/UPCON and the pull-down control signal DNCON relatively coincide with those of the main signal XMDR), the emphasis width of the output signal DOUT in the initial stage of driving is larger than that in CASE31 (a case where the driving time points of the pull-up control signal/UPCON and the pull-down control signal DNCON do not relatively coincide with those of the main signal XMDR).

The driving time point of the auxiliary signal XSDR is controlled, so that the driving time point of the output signal (DOUT) in the initial stage of driving is controlled. Therefore, in the output driver of the present invention, the efficiency of the transmission of the output signal DOUT to the reception system is improved.

Furthermore, as described above, the mode register set 300 receives the external control signal group EXCON, and generates the impedance control signal group XIM, the driving width control signal group XDR and the delay control signal group XDE. That is, in the output driver of the present invention, the logic states of the signals of the impedance control signal group XIM, the driving width control signal group XDR and the delay control signal group XDE are easily controlled using an external control signal group.

As a result, the amount of auxiliary impedance SIM, and the driving width and driving time point of the auxiliary signal XSDR can be readily controlled. Therefore, in the output driver of the present invention, the amount of output impedance OIM, a pre-emphasis width and a pre-emphasis time point can be readily controlled.

The above-described output driver of the present invention includes the main driving circuit for outputting and driving the main signal based on the data signal to a transmission line, the auxiliary driving circuit for outputting and driving the auxiliary signal to the transmission line, and the mode register set. Furthermore, the mode register set generates the impedance control signal group, the driving width control signal group and the delay control signal group. Furthermore, the amount of auxiliary impedance SIM, and the driving width and driving time point of the auxiliary signal XSDR can be controlled using the impedance control signal group, the driving width control signal group and the delay control signal group.

Therefore, in accordance with the output driver of the present invention, the amount of output impedance OIM, a pre-emphasis width and a pre-emphasis time point can be readily controlled, and the efficiency of the transmission of the output signal to the reception system is improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An output driver for generating an output signal, which is based on a combination of a main signal and an auxiliary signal, to a transmission line, the output driver comprising:
   a main driving circuit for generating the main signal based on a received data signal to the transmission line at a main impedance;
   an auxiliary driving circuit for emphasizing the output signal in an initial stage of the generation of the main signal to the transmission line, the auxiliary driving circuit generating the auxiliary signal based on the data signal to the transmission line at an auxiliary impedance; and
   a mode register set for generating an impedance control signal group and a driving width control signal group;
   wherein the auxiliary impedance can be controlled using the impedance control signal group such that during pre-emphasis an output impedance, comprising the main impedance and auxiliary impedance, matches a transmission impedance of the transmission line and a reception impedance of a reception system; and
   wherein a driving width of the auxiliary signal is controlled by the driving width control signal group such that an emphasis width of the output signal is controlled.

2. The output driver as set forth in claim 1, wherein the auxiliary driving circuit comprises:
   a driving control signal generation unit for providing a pull-up control signal and a pull-down control signal in response to the data signal; and
   a pre-emphasis driving unit for pulling up the auxiliary signal in response to the pull-up control signal and pulling down the auxiliary signal in response to the pull-down control signal.

3. The output driver as set forth in claim 2, wherein the driving control signal generation unit comprises:
   pull-up generation means driven to generate the pull-up control signal in response to the data signal; and
   pull-down generation means driven to pull down the auxiliary signal response to the pull-down control signal;
   wherein the pull-up generation means and the pull-down generation means are driven to control driving widths of the pull-up control signal and the pull-down control signal, respectively, in response to the driving width control signal group.

4. The output driver as set forth in claim 2, wherein the pre-emphasis driving unit comprises:
   pull-up driving means driven to pull up the auxiliary signal in response to the pull-up control signal; and
   pull-down driving means driven to pull down the auxiliary signal in response to the pull-down control signal,
   wherein conductance of the pull-up driving means and the pull-down driving means is controlled using the impedance control signal group.

5. The output driver as set forth in claim 2, wherein the pre-emphasis driving unit comprises:
   a plurality of driving means each driven to pull up the auxiliary signal in response to the pull-up control signal and to pull down the auxiliary signal in response to the pull-down control signal,
   wherein at least one of the driving means is enabled in response to a corresponding signal from the impedance control signal group.

6. An output driver for generating an output signal, which is based on a combination of a main signal and an auxiliary signal, to a transmission line, the output driver comprising:
   a main driving circuit for generating the main signal based on a received data signal to the transmission line at a main impedance;
   an auxiliary driving circuit for emphasizing the output signal in an initial stage of the generation of the main signal to the transmission line, the auxiliary driving circuit generating the auxiliary signal based on the data signal to the transmission line at an auxiliary impedance, wherein the auxiliary impedance is controlled during pre-emphasis such that an output impedance, comprising the main impedance and the auxiliary impedance, matches a transmission impedance of the transmission line and a reception impedance of a reception system; and
   a mode register set for generating an impedance control signal group and a delay control signal group;
   wherein a driving time point of the auxiliary signal is controlled by the delay control signal group such that a driving time point of the output signal is controlled.

7. The output driver as set forth in claim 6, wherein the auxiliary driving circuit comprises:
   a driving control signal generation unit for providing a pull-up control signal and a pull-down control signal in response to the data signal; and
   a pre-emphasis driving unit for pulling up the auxiliary signal in response to the pull-up control signal and pulling down the auxiliary signal in response to the pull-down control signal.

8. The output driver as set forth in claim 7, wherein the driving control signal generation unit comprises:
   pull-up delay means driven to delay an activation time point of the pull-up control signal in response to the data signal; and pull-down delay means driven to delay a driving time point of the pull-down control signal in response to the data signal;

wherein the pull-up delay means and the pull-down delay means are driven to control driving time points of the pull-up control signal and the pull-down control signal, respectively, using the delay control signal group.

9. The output driver as set forth in claim 7, wherein the pre-emphasis driving unit comprises:

pull-up driving means driven to pull up the auxiliary signal in response to the pull-up control signal; and pull-down driving means driven to pull down the auxiliary signal in response to the pull-down control signal, wherein conductance of the pull-up driving means and the pull-down driving means is controlled using the impedance control signal group.

10. The output driver as set forth in claim 7, wherein the pre-emphasis driving unit comprises:

a plurality of driving means each driven to pull up the auxiliary signal in response to the pull-up control signal and to pull down the auxiliary signal in response to the pull-down control signal, wherein at least one of the driving means is enabled in response to a corresponding signal from the impedance control signal group.

* * * * *

US007545164C1

(12) EX PARTE REEXAMINATION CERTIFICATE (7683rd)
United States Patent
Song et al.

(10) Number: US 7,545,164 C1
(45) Certificate Issued: Aug. 10, 2010

(54) OUTPUT DRIVER FOR CONTROLLING IMPEDANCE AND INTENSITY OF PRE-EMPHASIS DRIVER USING MODE REGISTER SET

(75) Inventors: In Dal Song, Seoul (KR); Jung Bae Lee, Yongin-si (KR)

(73) Assignee: Samsung Electronics Co., Ltd., Yeongtong-Gu, Suwon-Si, Gyeonggi-Do (KR)

Reexamination Request:
No. 90/010,724, Oct. 30, 2009

Reexamination Certificate for:
Patent No.: 7,545,164
Issued: Jun. 9, 2009
Appl. No.: 11/540,345
Filed: Sep. 29, 2006

(30) Foreign Application Priority Data

Sep. 30, 2005 (KR) .................. 10-2005-0091896

(51) Int. Cl.
*H03K 17/16* (2006.01)
*H03K 19/003* (2006.01)

(52) U.S. Cl. .................. 326/30; 326/27; 326/86; 326/87; 327/112; 327/264

(58) Field of Classification Search .................. None
See application file for complete search history.

(56) References Cited

U.S. PATENT DOCUMENTS

2002/0043997 A1    4/2002    Stark et al.

*Primary Examiner*—Linh My Nguyen (57) ABSTRACT

An output driver controls impedance using a mode register set. The output driver includes a main driving circuit that outputs and drives a main signal based on a data signal to a predetermined transmission line, an auxiliary driving circuit that outputs and drives an auxiliary signal to the transmission line, and a mode register set. The mode register set generates an impedance control signal group, a driving width control signal group and a delay control signal group. The amount of an auxiliary impedance (SIM), and the driving width and driving time point of an auxiliary signal (XSDR) can be controlled using the impedance control signal group, the driving width control signal group and the delay control signal group. Therefore, in accordance with the output driver of the present invention, the amount of output impedance (OIM), a pre-emphasis width and a pre-emphasis time point can be readily controlled, and the efficiency of the transmission of an output signal to a reception system is improved.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-10 is confirmed.

* * * * *